US009274137B2

(12) United States Patent
Moreau

(10) Patent No.: US 9,274,137 B2
(45) Date of Patent: Mar. 1, 2016

(54) ANTI-STICTION METHOD IN AN INERTIAL MEMS, CORRESPONDING COMPUTER PROGRAM PRODUCT, STORAGE MEANS AND DEVICE

(75) Inventor: Maurice Moreau, Landemont (FR)

(73) Assignee: Sercel, Carquefou (FR)

( * ) Notice: Subject to any disclaimer, the term of this patent is extended or adjusted under 35 U.S.C. 154(b) by 408 days.

(21) Appl. No.: 13/878,105

(22) PCT Filed: Oct. 6, 2011

(86) PCT No.: PCT/EP2011/067498
§ 371 (c)(1),
(2), (4) Date: Jun. 14, 2013

(87) PCT Pub. No.: WO2012/045835
PCT Pub. Date: Apr. 12, 2012

(65) Prior Publication Data
US 2013/0319076 A1    Dec. 5, 2013

(30) Foreign Application Priority Data

Oct. 6, 2010   (EP) .................................... 10186715

(51) Int. Cl.
*G01P 15/125*   (2006.01)
*G01P 21/00*   (2006.01)
(Continued)

(52) U.S. Cl.
CPC ............... *G01P 21/00* (2013.01); *B81B 3/0018* (2013.01); *B81C 1/00968* (2013.01); *G01P 15/125* (2013.01); *B81B 2201/0235* (2013.01)

(58) Field of Classification Search
CPC . G01P 15/125; G01P 15/0802; G01P 15/131; B81B 3/0016; B81B 3/0051; B81B 3/0018

USPC ............ 73/514.32, 510, 493, 514.36, 514.38, 73/1.37, 1.38, 1.77
See application file for complete search history.

(56) References Cited

U.S. PATENT DOCUMENTS

| 5,542,295 A * | 8/1996 | Howe et al. ................. 73/514.18 |
| 6,871,544 B1 * | 3/2005 | Selvakumar et al. ...... 73/514.18 |
| 2003/0160540 A1 * | 8/2003 | Miller et al. .................. 310/309 |

(Continued)

OTHER PUBLICATIONS

Jone W-B et al: "A Dual-Mode Built-in Self-Test Technique for Capacitive MEMS Devices", IEEE Transactions on Instrumentation and Measurement, IEEE Service Center, Piscatawy, NJ, US, vol. 54, No. 5, Oct. 1, 2005, pp. 1739-1750, XP011140021.

(Continued)

*Primary Examiner* — Helen Kwok
(74) *Attorney, Agent, or Firm* — David D. Brush; Westman Champlin & Koehler, P.A.

(57) ABSTRACT

An anti-stiction method is proposed in an inertial micro-electro-mechanical device. The device includes: a mobile mass, suspended to an armature via a spring, and having at least one mobile electrode; and at least one fixed electrode rigidly attached to the armature, each fixed electrode cooperating with one of the at least one mobile electrode to form a pair of electrodes. The anti-stiction method carries out a step of detecting, for at least one stuck pair of electrodes, a stiction associated to a stiction force and a step of applying, during a predetermined time period, a predetermined voltage between the electrodes of at least one of the pair or pairs of electrodes, so as to create an electrostatic force which generates a displacement of the mobile mass according to the direction of the stiction force.

7 Claims, 4 Drawing Sheets

(51) Int. Cl.
 *B81C 1/00* (2006.01)
 *B81B 3/00* (2006.01)

(56) References Cited

U.S. PATENT DOCUMENTS

| | | | | |
|---|---|---|---|---|
| 2007/0075942 | A1* | 4/2007 | Martin et al. | 345/84 |
| 2009/0145230 | A1* | 6/2009 | Ikeuchi et al. | 73/514.32 |
| 2009/0320557 | A1* | 12/2009 | Sammoura et al. | 73/9 |
| 2014/0144235 | A1* | 5/2014 | Suzuki | 73/514.32 |
| 2014/0345380 | A1* | 11/2014 | Jia et al. | 73/514.32 |

OTHER PUBLICATIONS

Extended European Search Report for European Patent Application No. 10186715 dated May 6, 2011, 6 pages.

International Preliminary Report on Patentability dated Apr. 26, 2012 for corresponding International Patent Application No. PCT/EP2011/067498, 5 pages.

International Search Report and Written Opinion dated Dec. 21, 2011 for corresponding International Application No. PCT/EP2011/067498, filed Jun. 10, 2011.

* cited by examiner

ANTI-STICTION METHOD IN AN INERTIAL MEMS, CORRESPONDING COMPUTER PROGRAM PRODUCT, STORAGE MEANS AND DEVICE

CROSS-REFERENCE TO RELATED APPLICATIONS

This application is a Section 371 National Stage Application of International Application No. PCT/EP2011/067498, filed Oct. 6, 2011, which is incorporated by reference in its entirety and published as WO 2012/045835 on Apr. 12, 2012, in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE INVENTION

The field of the invention is that of inertial micro-electro-mechanical systems (also called inertial MEMS), used as inertial sensors, such as accelerometers or gyroscopes for example.

More specifically, the invention pertains to a technique for overcoming stiction of micro-surfaces facing one another, such as conductive electrodes in an inertial MEMS device.

The invention can apply specially but not exclusively in the implementation of an inertial MEMS device comprising conductive electrodes that are equipped with conductive fingers.

TECHNOLOGICAL BACKGROUND

MEMS are very small integrated systems that combine mechanical and electrical components, which traditionally range in size from the micrometer to the millimeter level.

The difficulty in controlling surface forces existing inside inertial MEMS devices is a critical obstacle to their fabrication and using. In particular, surface phenomena such as stiction of two micro-surfaces facing one another frequently restrict the operational environment and limit the lifetime of these devices.

By definition, stiction phenomenon occurs when surface adhesion forces (or stiction forces) are higher than mechanical restoring forces of the micro-surfaces.

In addition, with the decrease in the dimension of MEMS microstructures over recent years, this surface phenomenon has become more and more effective.

A well-known problem is in-use stiction that appears during operation and handling of inertial MEMS devices when micro-surfaces, such as conductive electrodes, come into contact and permanently adhere to each other, causing MEMS failure. In-use stiction may be caused by the following stiction forces: capillary, electrostatic (or Van Der Walls) and chemical bonding forces. Those stiction forces essentially depend upon nature of the used materials in the inertial MEMS device, surface topography and surface treatment method.

One particular structure of such an inertial MEMS device, as illustrated in FIG. 1, consists for example of a mobile mass 150 comprising one mobile electrode, suspended by springs means 115 to an armature (not shown), said mobile electrode comprising a plurality of conductive fingers 155. The inertial MEMS device further comprises two sets of two fixed electrodes 120a, 120b, rigidly attached to the armature, each fixed electrodes comprising two conductive fingers 125a, 125b. Each conductive finger 125a, 125b faces one of the mobile mass fingers 155 to form a pair of conductive fingers (with associated capacitance value) that is used to move down or up the mobile mass along a sensitive axis 130.

Here below, "spring means" (also called "flexible beam") is understood to be every flexible connection means for elastically relying the mobile mass to the armature.

The technical problem of reducing probability of finger stiction in-use of an inertial MEMS device is a problem known by a person skilled in the art and several techniques have been provided to solve it.

A first known technique consists in rising restoring forces of springs 115 by rising spring stiffness and/or mobile mass excursion. But to obtain higher spring stiffness, inertial MEMS developers are forced to conceive more massive springs, which makes the inertial MEMS device less compact. Also, if spring stiffness increases, sensitivity of the inertial MEMS device and so signal-to-noise ratio (or SNR) are reduced.

Furthermore, even for an inertial MEMS device comprising such massive springs, in-use stiction phenomenon still persists.

A second known technique consists in reducing stiction forces by means of a suitable coating of surfaces of the conductive fingers which are susceptible to come in contact, such a coating—as known as "anti-stiction coating"—being made of a low-energy surface material and/or a high-roughness surface material.

However, low-energy surface coatings require a surface treatment process, which has the well-known drawbacks of complexity of implementation, manufacture and of cost.

In addition, even for conductive finger surfaces treated with an anti-stiction coating, in-use stiction phenomenon is still of concern.

Therefore, one common drawback of these two aforesaid prior-art techniques is that they are not sufficiently effective, since they do not ensure that the problem of MEMS in-use stiction is totally eliminated. It therefore becomes impossible to ensure to a user that his inertial MEMS device will not be in a non-functioning state.

To overcome this drawback, it may be a common practice to apply one or several mechanical shock(s) to the MEMS device according to its sensitive axis, for example by means of a vibration system, in order to add an additional force component to the restoring force of springs so as to generate a restoring force higher than the stiction forces. This practice can be complex to implement and cost a lot.

A third known technique, as illustrated in the patent document US 2007/075942, consists in applying a predefined voltage between the conductive electrodes of the MEMS device, so as to create an electrostatic force that generates a displacement of the mobile mass according to a direction opposite to the direction of the stiction force, thereby leading to a separation of the stuck conductive electrodes.

SUMMARY

One particular embodiment of the invention proposes an anti-stiction method in an inertial micro-electro-mechanical device comprising:

a mobile mass, suspended to an armature via spring means, said mobile mass comprising at least one mobile electrode; and at least one fixed electrode rigidly attached to said armature, each fixed electrode cooperating with one of said at least one mobile electrode to form a pair of electrodes;

the method comprising:

a step of detecting, for at least one stuck pair of electrodes, a stiction associated to a stiction force;

at least one separating step, comprising a step of applying, during a predetermined time period, a predetermined voltage between the electrodes of at least one of said pair or pairs of electrodes, to create an electrostatic force which generates a displacement of the mobile mass according to the direction of said stiction force.

The general principle of one particular embodiment of the invention therefore is that of, upon detection of presence of an electrode stiction, applying a predetermined voltage between electrodes of the inertial micro-electro-mechanical device so as to generate a movement of the mobile mass according to the direction of the stiction force, during a predetermined time period, in order to tighten the stuck electrodes pair or pairs. Thus, once the predetermined voltage application is stopped, the created electrostatic force is released, thereby generating restoring forces such that they efficiently displace the mass mobile in a direction opposite to the stiction force direction with the aim to constrain the electrodes for which a stiction has been detected to separate from each other. In other words, the electrostatic forces created on the stuck electrodes can be compared to the bandage of a bow which enables to store energy, this energy being then transmitted to the arrow when bandage is released.

Thus, only a simple voltage application being necessary to overcome the electrode stiction, this embodiment of the invention provides an anti-stiction method that relies solely on means classically used in inertial MEMS devices and so that is simple to implement and costs little.

In case the separation of the electrodes of stuck pair or pairs of electrodes has not been obtained after executing the separation step, it may eventually be an advantageous practice to reiterate as many times as necessary this separation step until a separation of the electrodes is definitively obtained.

It should be noted that by means of a simple measurement of a differential capacitance (between a first capacitance of at least one pair of electrodes enabling a displacement of the mobile mass according to a first direction and a second capacitance of at least one pair of electrodes enabling a displacement of the mobile mass according to a second direction), it is thus possible to detect an electrode stiction, the sign of this differential capacitance enabling to know the direction in which the stiction occurs. Therefore, an appropriate anti-stiction process may be carrying out as a function of the determined stiction direction.

Advantageously, for at least one of said pairs of electrodes, the device comprises at least one contact stop attached to one electrode of said at least one pair of electrodes, and extending towards the other electrode of at least one pair of electrodes to limit contact surface of the electrodes.

Electrodes of a stuck pair of electrodes endowed with a contact stop having a low-energy surface, the unsticking probability of these electrodes is thus improved.

In a hypothetical case in which all pairs of electrodes between which the predetermined voltage is applied are stuck, the presence of one or more contact stops on the fixed electrode and/or mobile electrode nevertheless gives the possibility to create an electrostatic force that generates a displacement of the mobile mass according to the direction of said stiction force in order to separate electrodes of all or part of stuck pairs of electrodes. Indeed, a contact stop has a very low level of conductivity, which avoids having a total short-circuit of a pair of electrodes when these electrodes are stuck. Furthermore, there is a size dispersion of the contact stops, giving impossibility of having the same size of contact stop on the set of pairs of electrodes of the MEMS device. Therefore, even if this hypothetical case occurs, it is possible to generate an effective bow effect.

Advantageously, when said predetermined time period has elapsed, said predetermined voltage is stopped within a time-stop period such that the ratio between the time-stop period and the response of the mass-spring system formed by said mobile mass and said spring means, is inferior or equal to 10%.

Thus, an effective "bow effect" is ensured to be performed, thereby improving the probability for unsticking stuck electrodes.

Advantageously, said at least one mobile electrode comprises a plurality of mobile fingers and said at least one fixed electrodes comprises a plurality of fixed fingers, each fixed finger cooperating with one mobile finger to form a pair of fingers forming a capacitance, each mobile finger being movable relative to one fixed finger under an acceleration, thus creating a variation of capacitance, and said predetermined voltage is applied between the fingers of at least one of said pair or pairs of fingers, so as to create said electrostatic force which generates a displacement of the mobile mass according to the direction of said stiction force.

Advantageously, for at least one of said pairs of fingers, the device comprises at least one contact stop attached to one finger of said at least one pair of fingers, and extending towards the other finger of at least one pair of fingers to limit contact surface of the fingers. Besides the fact of having fingers with a low-energy surface, the bow effect is optimized thanks to the presence of such contact stop.

In practice, they are the fingers of unstuck pairs of fingers that enable to create a bow effect. In a hypothetical case in which all pairs of fingers are stuck, the presence of contact stops on the fixed finger and/or mobile finger nevertheless gives the possibility to create an electrostatic force that generates a displacement of the mobile mass according to the direction of said stiction force, thereby causing separation of fingers of all or part of stuck pairs of fingers. Indeed, in the one hand, a contact stop has a very low level of conductivity, which avoids having a total short-circuit of a pair of fingers when these fingers are stuck. In the other hand, there is a size dispersion of the contact stops, giving impossibility of having the same size of contact stop on the set of pairs of fingers of the MEMS device. The same reasoning may be also applied on the dispersion of distance between the mobile and fixed fingers of the set of the pairs of fingers of the MEMS device. Thus, the probability of having all pairs of fingers stuck is extremely weak.

In another embodiment of the invention, there is proposed a computer program product comprising program code instructions for implementing the above-mentioned method (in any one of its different embodiments) when said program is executed on a computer.

In another embodiment of the invention, there is proposed a computer-readable storage means storing a computer program comprising a set of instructions executable by a computer to implement the above-mentioned method (in any one of its different embodiments).

In another embodiment of the invention, there is proposed an anti-stiction device intended to cooperate with an inertial micro-electro-mechanical device comprising:

a mobile mass, suspended to an armature via spring means, said mobile mass comprising at least one mobile electrode; and at least one fixed electrode rigidly attached to said armature, each fixed electrode cooperating with one of said at least one mobile electrode to form a pair of electrodes;

the anti-stiction device comprising:

means for detecting, for at least one stuck pair of electrodes, a stiction associated to a stiction force;

means for applying, during a predetermined time period, a predetermined voltage between the electrodes of at least one of said pair or pairs of electrodes, to create an electrostatic force so as to generate a displacement of the mobile mass according to the direction of said stiction force.

LIST OF FIGURES

Other features and advantages of embodiments of the invention shall appear from the following description, given by way of an indicative and non-exhaustive example, and from the appended drawings, of which:

FIG. 1 already described with reference to the prior art, presents a schematic example of the structure of an inertial MEMS device on which the anti-stiction method can be implemented;

DETAILED DESCRIPTION

In all the figures of the present document, the identical elements and steps are designated by a same numerical reference.

FIGS. 1, 2, 3a and 3b described below concern a schematic example of the structure of an inertial MEMS device on which is implemented the anti-stiction method, according to a particular embodiment of the invention. Such a device comprising one mobile mass suspended to an armature via spring means and equipped with one mobile electrode, and several fixed electrodes. More precisely, the mobile electrode comprises a plurality of mobile conductive fingers and each fixed electrode comprises a plurality of fixed conductive fingers, each fixed finger being placed in front and parallel of (and cooperating with) one corresponding mobile finger to form a pair of conductive fingers. It is understood that the inertial MEMS device to which the present invention can be applied may have conductive electrodes with no fingers and the illustratory example described in detail here below would be adapted accordingly. Especially, the anti-stiction method illustrated below is applied to separate conductive fingers (thereby considered as conductive electrodes) but can more generally be applied to separate conductive electrodes that are not equipped with conductive fingers.

Figure 1:
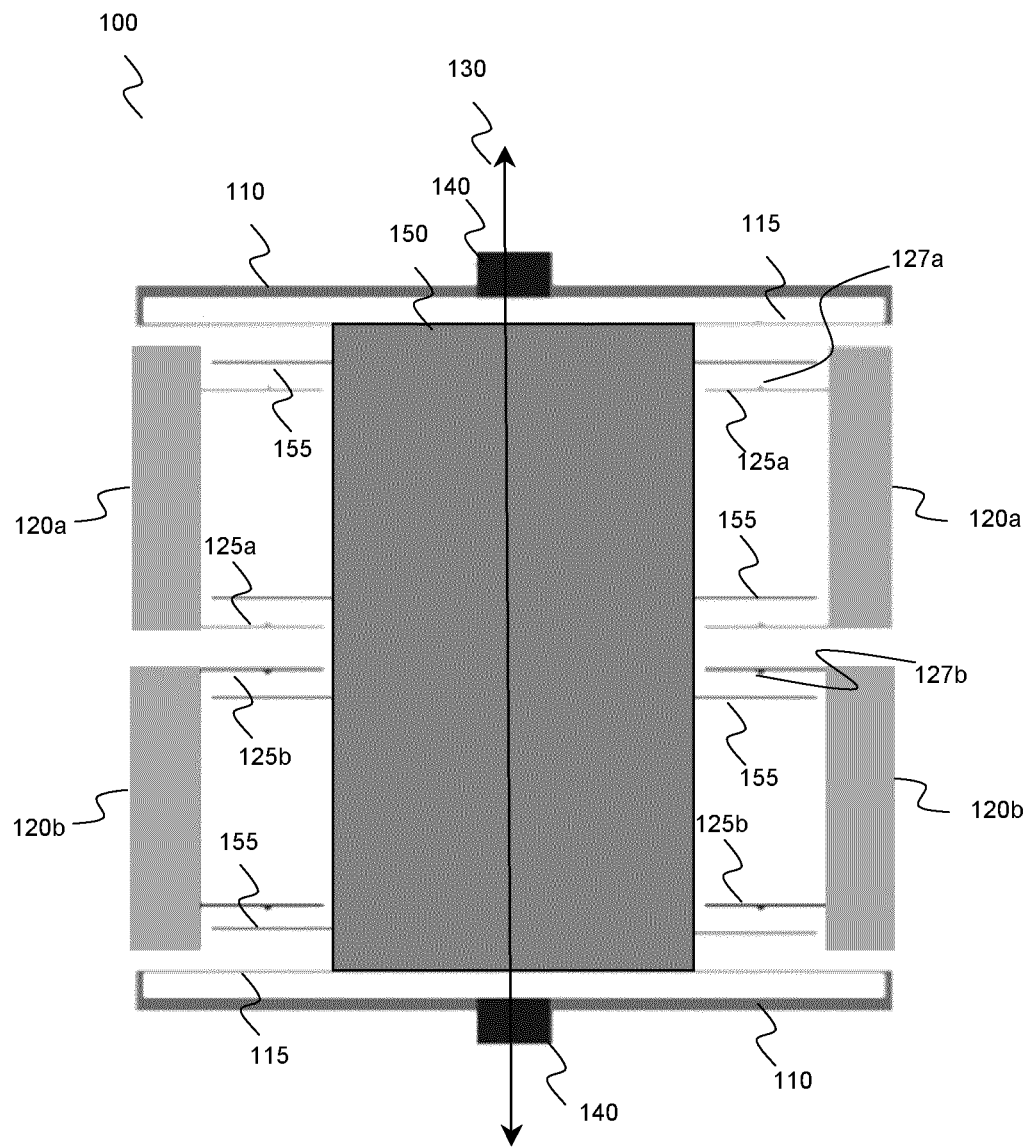

FIG. 1 already described with reference to the prior art, shows a schematic example of the structure of an inertial MEMS device 100 on which the anti-stiction method can be implemented, according to a particular embodiment of the invention. The inertial MEMS device 100 comprises the following elements:

an armature (not shown in FIG. 1) to which are attached fixed supports 110 and anchoring means 140;

a mobile mass 150, forming a mobile electrode which is suspended from the fixed supports 110, by springs 115 and endowed with several conductive fingers 155;

a first set of two fixed electrodes 120a, rigidly attached to the armature, each comprising two conductive fingers 125a, each cooperating with one of the mobile mass fingers 155 to form a pair of fingers (125a,155) used to move down the mobile mass 150 along the sensitive axis 130;

a second set of two fixed electrodes 120b, rigidly attached to the armature, each comprising two conductive fingers 125b, each cooperating with one of the mobile mass fingers 155 to form a pair of fingers (125b,155) used to move up the mobile mass 150 along the sensitive axis 130.

The mobile mass 150—i.e. the mobile electrode—(and its fingers), the armature, the two sets of fixed electrodes (and their fingers) and the springs are micromachined in a semiconductor substrate (Silicon for example), by means of usual microfabrication technological processes of microelectronics.

The mobile electrode is electrically insulated from the fixed electrodes. Each pair of fingers of the MEMS device 100 constitutes a variable capacitance for measuring the displacements of the mobile mass 150 and controlling the displacements thereof according to the sensitive axis 130 by means of application of a predetermined voltage.

The fixed and mobile electrodes thus fulfill, via the pairs of fingers two functions:

detecting the position of the mobile mass 150 relative to the armature by measuring variation of the capacitance of pairs of fingers;

generating electrostatic forces, which make the mobile mass 150 moving up or down along the sensitive axis 130 as a function of the set of fixed electrodes 120a or 120b on which is applied a voltage (in the range of 1 to 10 volts for instance) relative to the mobile electrode. This MEMS device 100 may be associated with an electronic feedback system (non illustrated on FIG. 1), which enables to replace the mobile mass in an idle position after having detected a displacement of the mobile mass. In way of example, the displacement of the mobile mass is due to a seismic acceleration applied to the MEMS device, such as an accelerometer. Feedback electrostatic forces applied to the mobile mass by means of a voltage generated between the fixed and mobile electrodes compensate for the seismic acceleration in view to place again the mobile mass in an idle position.

In a particular embodiment of the invention, each fixed electrode finger 125a, 125b is equipped with a contacting stop 127a, 127b, which extends towards the mobile mass finger of the pair of fingers. These contacting stops aim at limiting the contact surface between the fixed electrode finger and the mobile mass finger of each pair of fingers in order to prevent the risk of finger stiction in the MEMS device.

It should be noted that the number of fixed electrodes and of fingers shown in FIG. 1 (as well as FIGS. 2, 3a and 3b) is deliberately limited by way of a purely pedagogical description, so as not to burden the figure and the associated description.

Figure 2:
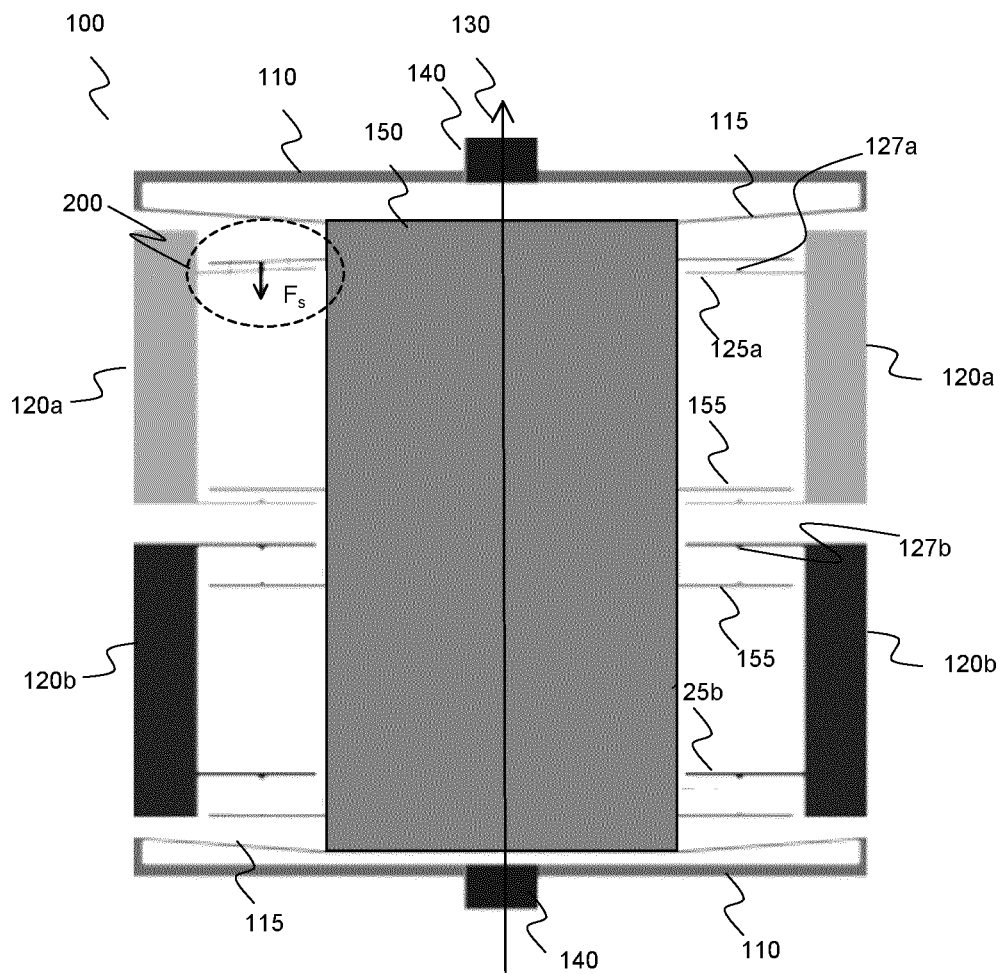
FIG. 2 illustrates the inertial MEMS device of FIG. 1 having an electrode stiction.

FIG. 2 illustrates the inertial MEMS device of FIG. 1 having an electrode stiction.

Contrary to the example of FIG. 1 according to which the mobile mass is in an idle position (since springs 115 are not deformed), the mobile mass in FIG. 2 is in a contact position (since springs are deformed). The spring deformation is due to presence of a finger stiction of the pair of fingers 200 located in top left of the MEMS device.

As a general principle, the step of detecting the stiction consists in measuring the differential capacitance (noted ΔC below). As shown at the left of the sensitive axis 130 of FIG. 1, two variable capacitances are defined:
- a first variable capacitance C1 which represents the average capacitance of all the pairs of fingers (125a, 155) used to move down the mobile mass 150 along the sensitive axis 130; and
- a second variable capacitance C2 which represents the average capacitance of all the pairs of fingers (125b, 155) used to move up the mobile mass 150 along the sensitive axis 130.

In case of stiction (for example stiction of fingers of the pair of fingers referenced 200 on FIG. 2), the mobile mass 150 is far from its idle position and a differential capacitance between the first and second variable capacitances, defined as ΔC=C1−C2, can be detected and measured by electronics means. As it is possible to determine the sign of this differential capacitance ΔC, it is further possible to know the direction in which the stiction occurs (up or down along the sensitive axis 130) and therefore carry out the anti-stiction process as a function of the known stiction direction.

It should be noted that, when a stiction occurs, the mobile mass is in a contact position regardless of the fact that the MEMS device is in an idle state or in an active state.

The finger stiction is defined by a stiction force (noted $F_s$), oriented downward according to an axis parallel to the sensitive axis 130a, which tends to sustain the mobile mass 150 in a downward position. The resulting deformation of the four springs 115 generates a restoring force ($F_r$), oriented according to a direction opposite to the stiction force direction. Generally, this restoring force is greater than the stiction force and in this case the mobile mass 150 returns to the idle position. Here, as the restoring force is not greater than the stiction force, the mobile mass 150 stays in a contact position (there is a stiction), and this could cause MEMS failure.

Figure 3A:
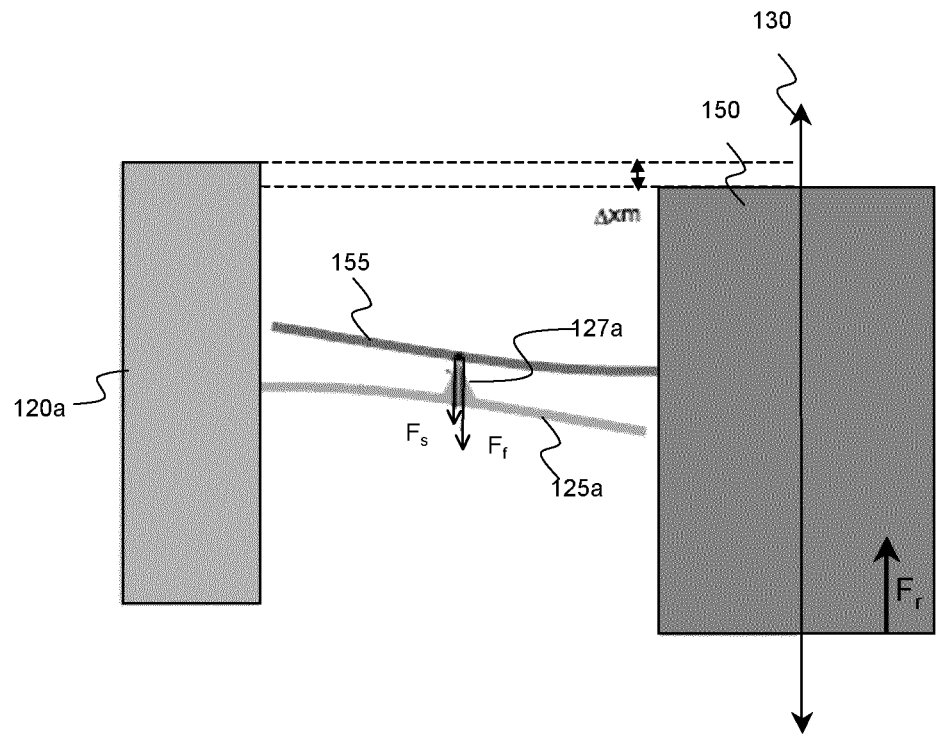
FIGS. 3a and 3b illustrate the principle of an anti-stiction method applied to the inertial MEMS device of FIG. 2, according to a particular embodiment of the invention.
Figure 3B:
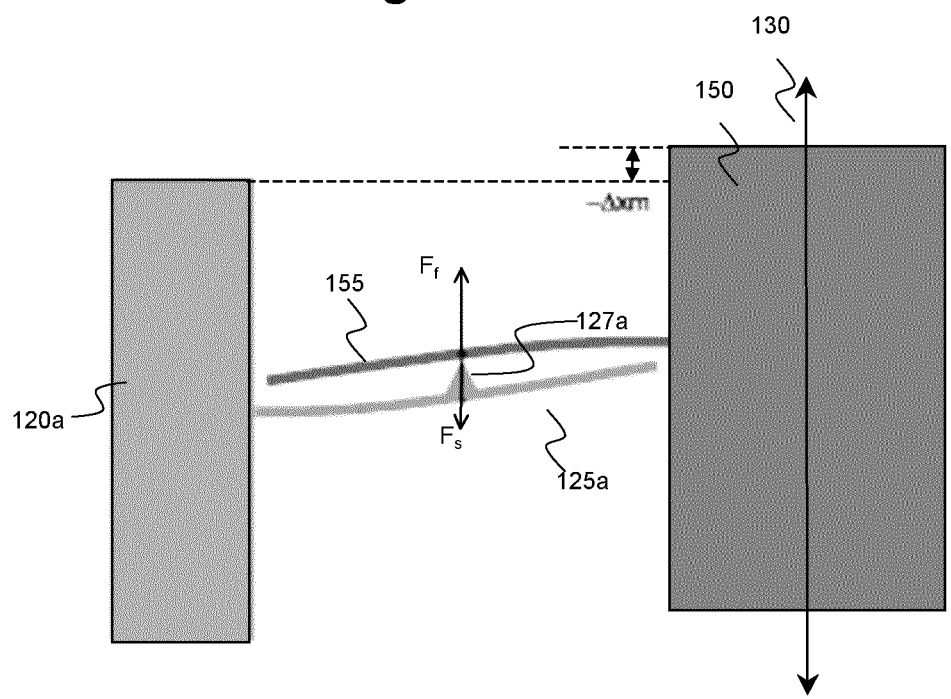

FIGS. 3a and 3b illustrate the principle of an anti-stiction method applied to the inertial MEMS device of FIG. 2, according to a particular embodiment of the invention. FIGS. 3a and 3b illustrate a first phase and a second phase of this anti-stiction process respectively.

This particular embodiment of the invention consists in implementing a finger separating process based on a "bow effect". It is divided into two main phases detailed below.

Here below, the finger stiction is considered to be located on top left of the MEMS device of FIG. 2.

After detecting presence of finger stiction for the upper fixed electrode 120a, a first phase (FIG. 3a) is executed. It consists in applying, during a short time period (such as 100 μs for example) a predetermined voltage (a value comprised between 5 and 10V for example) so as to generate an electrostatic force (noted $F_e$) in the same direction as the one of the stiction force (noted $F_s$). This generated electrostatic force ($F_e$) creates a displacement of the mobile mass 150 according to the stiction force direction, which deforms the springs 115 and mainly the fixed electrode finger and the mobile electrode finger of the pair of fingers for which a stiction has been detected, such that:

$$F_e = F_r + F_f$$

with:
$F_r$, the spring restoring force due to the deformation of the four springs 115; and
$F_f$, the finger restoring force due to both the deformation of the fixed electrode finger 125a and the mobile electrode finger 155.

Thus, the difference between $F_e$ and $F_r$ applies to the fixed electrode finger and the mobile electrode finger deformations.

Each pair of fingers 125a and 155 behaves as a spring with stiffness $K_d$. The finger deformation energy (noted Edd), which is stored in the deformations of the pair of fingers, can be defined as follow:

$$Edd = \tfrac{1}{2} \cdot K_d \cdot \Delta x m^2$$

with:
$K_d$: the spring stiffness of the pair of fingers:

$$Kd = \frac{Kdf \cdot Kdm}{Kdf + Kdm}$$

Kdf: stiffness of the fixed electrode finger;
Kdm: stiffness of the mobile electrode finger;
Δxm: displacement of the mobile mass 150, related to the deformation of the pair of fingers.

A second phase (FIG. 3b) is then executed. It consists in, after the short time period (of 100 μs in this example) has elapsed, stopping applying the predetermined voltage between the first set of fixed electrodes 120a and the mobile electrode. In that way, when the voltage is no longer generated (i.e. when the force $F_e$ is no longer applied), the spring restoring force and the restoring force are applied to the mobile mass.

It must be noted that the voltage has to be stopped with a time-stop period such that the ratio between the time-stop period and the response time of the mass-spring system is inferior or equal to 10%. More precisely, by way of example, typical value for the time-stop period and the response of the mass-spring system are respectively 100 μs and 1 ms.

As a consequence, when the voltage is canceled, the deformation energy Edd of the pair of fingers changes into kinetic energy by transmitting velocity to the mobile mass 150 in the form of axial thrust.

When the value of this deformation energy Edd is zero, the kinetic energy is maximal and the different forces, which are applied on the mobile mass 150, are the spring restoring force $F_r$ and the stiction force $F_s$.

In presence of a stiction force $F_s$, the mobile mass 150 deforms the pair of fingers with a maximum use of kinetic energy and spring restoring force. When the kinetic energy disappears (i.e. when the pair of fingers (125a, 155) has a deformation opposite to the deformation in first phase), the finger restoring force $F_f$ applies to the pair of fingers. Therefore, the maximum force (also called below as separating force) which applies on the pair of fingers, in order to cause a separation between the mobile mass finger 155 and the fixed electrode finger 125a, is equal to the summation of the spring restoring force $F_r$ and the finger restoring force $F_f$. In other words, this maximum force corresponds to the electrostatic force ($F_e$) that has been applied in phase 1.

To facilitate understanding of the phenomenon created during execution of the first and second phases, this one can be compared to the bandage of a bow which enables to store energy, this energy being then transmitted to the arrow when bandage is canceled.

In case the separation of the electrodes has not been obtained after executing the separation step, it may eventually be an advantageous practice to reiterate as many times as necessary this separation step until a separation of the electrodes is definitively obtained.

Figure 4:
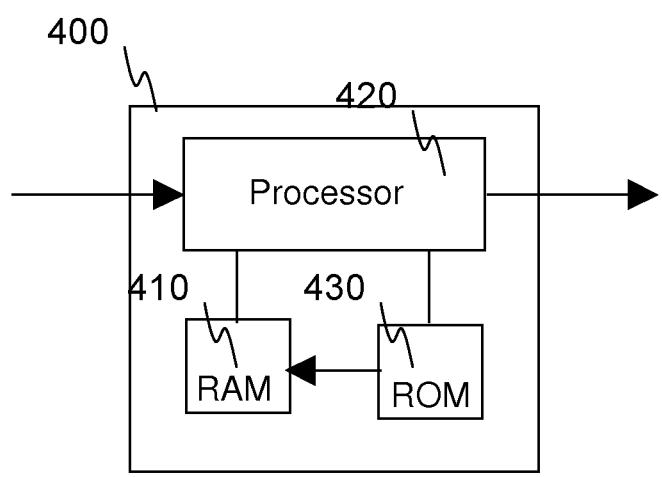
FIG. 4 shows the schematic structure of an anti-stiction device implementing the anti-stiction method, according to a particular embodiment of the invention.

Now referring to FIG. 4, we present the simplified structure of an anti-stiction device 400 implementing the anti-stiction method, according to one particular embodiment of the invention.

The anti-stiction device includes:
a read-only memory (ROM) 430;
a random access memory (RAM) 410; and
a processor 420.

The read-only memory 430 stores a executable code of the programs, which, when are executed by the processor 420, enable implementation of the technique of the invention, e.g., the rules and operations of which are described above in connection with FIGS. 2, 3a and 3b.

Upon initialization, the aforementioned program code instructions are transferred to the random access memory 410 so as to be executed by the processor 420. The random access memory 410 likewise includes registers for storing the variables and parameters required for this execution. The processor 420 receives a stiction information indicating presence of stiction in the inertial MEMS device to which the stiction device 400 is associated and, according to the instructions of the aforementioned programs, delivers a voltage information indicating application of a predetermined voltage to the fixed electrodes.

All the steps of the anti-stiction process of FIGS. 2, 3a, 3b can be implemented equally well:
- by the execution of a set of computer instructions executed by a reprogrammable computing machine such as a PC type apparatus, a DSP (a digital signal processor) or a microcontroller can be stored in a storage medium that is detachable (for example a floppy disk, a CD-ROM or a DVD-ROM) or non-detachable; or else
- by a dedicated machine or component such as an FPGA (Field Programmable Gate Array), an ASIC (Application-Specific Integrated Circuit) or any dedicated hardware component.

An embodiment of the invention provides an anti-stiction technique that overcomes the undesirable effects related to the stiction of conductive fingers (or more generally of conductive electrodes) within an inertial MEMS device.

An embodiment of the invention provides a technique of this kind that is simple to implement and costs little.

An embodiment of the invention provides a technique that relies solely on means classically used within an inertial MEMS device.

The invention claimed is:

1. An anti-stiction method in an inertial micro-electro-mechanical device comprising:
   a mobile mass, suspended to an armature via a spring, said mobile mass comprising at least one mobile electrode; and
   at least one fixed electrode rigidly attached to said armature, each fixed electrode cooperating with one of said at least one mobile electrode to form a pair of electrodes;
   said anti-stiction method comprising:
      a step of detecting, for at least one stuck pair of electrodes, a stiction associated to a stiction force,
      at least one separating step, comprising a step of applying, during a predetermined time period, a predetermined voltage between the electrodes of at least one of said pair of electrodes, so as to create an electrostatic force which generates a displacement of the mobile mass according to a direction of said stiction force.

2. The anti-stiction method according to claim 1, wherein, when said predetermined time period has elapsed, said predetermined voltage is stopped within a time-stop period such that a ratio between the time-stop period and a response of a mass-spring system formed by said mobile mass and said spring is less than or equal to 10%.

3. A computer-readable storage memory storing a computer program comprising a set of instructions executable by a computer to implement an anti-stiction method in an inertial micro-electro-mechanical device comprising:
   a mobile mass, suspended to an armature via a spring, said mobile mass comprising at least one mobile electrode; and
   at least one fixed electrode rigidly attached to said armature, each fixed electrode cooperating with one of said at least one mobile electrode to form a pair of electrodes;
   said anti-stiction method comprising:
      a step of detecting, for at least one stuck pair of electrodes, a stiction associated to a stiction force,
      at least one separating step, comprising a step of applying, during a predetermined time period, a predetermined voltage between the electrodes of at least one of said pair of electrodes, so as to create an electrostatic force which generates a displacement of the mobile mass according to a direction of said stiction force.

4. An anti-stiction device configured to cooperate with an inertial micro-electro-mechanical device comprising:
   a mobile mass, suspended to an armature via a spring means, said mobile mass comprising at least one mobile electrode; and
   at least one fixed electrode rigidly attached to said armature, each fixed electrode cooperating with one of said at least one mobile electrode to form a pair of electrodes;
   said anti-stiction device comprising:
      means for detecting, for at least one stuck pair of electrodes, a stiction associated to a stiction force,
      means for applying, during a predetermined time period, a predetermined voltage between the electrodes of at least one of said pair of electrodes, so as to create an electrostatic force which generates a displacement of the mobile mass according to a direction of said stiction force.

5. The anti-stiction device according to claim 4, wherein the device comprises, for at least one of said pair of electrodes, at least one contact stop attached to one electrode of said at least one pair of electrodes, and extending towards the other electrode of said at least one pair of electrodes to limit contact surface of the electrodes.

6. An anti-stiction device according to claim 4, wherein said at least one mobile electrode comprises a plurality of mobile fingers and said at least one fixed electrode comprises a plurality of fixed fingers, each fixed finger cooperating with one mobile finger to form a pair of fingers forming a capacitance, each mobile finger being movable relative to one fixed finger under an acceleration, thus creating a variation of capacitance,
   and said means for applying applies the predetermined voltage between the fingers of at least one of said pair of fingers, so as to create said electrostatic force which generates a displacement of the mobile mass according to the direction of said stiction force.

7. The anti-stiction device according to claim 6, wherein the device comprises, for at least one of said pair of fingers, at least one contact stop attached to one finger of said at least one pair of fingers, and extending towards the other finger of said at least one pair of fingers to limit contact surface of the fingers.

* * * * *